US005243658A

United States Patent [19]

Sakata

[11] Patent Number: 5,243,658

[45] Date of Patent: Sep. 7, 1993

[54] MODULATION EFFECT ADDING APPARATUS

[75] Inventor: Goro Sakata, Mitaka, Japan

[73] Assignee: Casio Computer Co., Ltd., Tokyo, Japan

[21] Appl. No.: 732,812

[22] Filed: Jul. 19, 1991

[30] Foreign Application Priority Data

Aug. 10, 1990 [JP] Japan .................................. 2-212235
Aug. 10, 1990 [JP] Japan .................................. 2-212236

[51] Int. Cl.[5] .............................................. H03G 3/00

[52] U.S. Cl. ....................................... 381/62; 84/629; 84/624

[58] Field of Search ................. 84/624, 629, 630, 694, 84/705, 706, 707, 708, 709, DIG. 4; 381/61, 62, 63, 118

[56] References Cited

U.S. PATENT DOCUMENTS

| | | | |
|---|---|---|---|
| 4,184,047 | 1/1980 | Langford | 381/63 |
| 4,208,940 | 6/1980 | Tsurubuchi | 84/708 |
| 4,384,505 | 5/1983 | Cotton, Jr. et al. | 84/708 |
| 4,569,268 | 2/1986 | Futamase et al. | 381/62 |
| 4,611,300 | 9/1986 | Taylor, Jr. et al. | 381/63 |

OTHER PUBLICATIONS

Lancaster, "Timbic & Voicing Circuits for Electronic Music", Popular Electronics, Jun. 1975.

Ward, Electronic Music Circuit Guidebook, 1975, pp. 107-109.

*Primary Examiner*—Forester W. Isen

*Attorney, Agent, or Firm*—Frishauf, Holtz, Goodman & Woodward

[57] ABSTRACT

A modulation effect adding apparatus in which when an input signal is written into a memory and read and output with a given delay time, the delay time is changed depending on an LFO waveform to thereby add a modulation effect to the input signal. The LFO waveform is obtained by passing through a low pass filter a waveform signal comprising multiple high harmonic components and changing in a positive- or negative-going direction at a particular period. By changing the characteristic of the low pass filter, various LFO waveforms are obtained. An offset value corresponding to the maximum peak value of the LFO waveform is added to the LFO waveform, and the resulting waveform is multiplied by an offset value having a predetermined magnification and inverting the waveform signal to thereby prevent a memory read address from disadvantageously exceeding a write address.

18 Claims, 18 Drawing Sheets

TRIANGULAR WAVEFORM GENERATOR 21 OUTPUT

LPF 22 OUTPUT

MULTIPLIERS (25,26) OUTPUTS

FIG.9

COEFFICIENT MEMORY (P) MEMORY MAP

| ADDRESS | DATA NAME | CONTENTS |
|---|---|---|
| 0 | GF | TRIANGULAR WAVEFORM PARAMETER |
| 1 | G | LPF COEFFICIENT |
| 2 | 1-G | LPF COEFFICIENT |
| 3 | -FMD | MODULATION DEPTH |

FIG.11

DELAY OFFSET MEMORY (T) MEMORY MAP

| ADDRESS | DATA NAME | CONTENTS |
|---|---|---|
| 0 | -DT | DELAY TIME OFFSET |
| 1 | -DT+1 | DELAY TIME OFFSET |

FIG.10

WORK MEMORY (W) MEMORY MAP

| ADDRESS | DATA NAME | CONTENTS |
|---|---|---|
| 0 | TRI | TRIANGL WAVE GENERATOR OUTPUT |
| 1 | SIN | LPF OUTPUT |
| 2 | 0.5 | SHIFT CONSTANT |
| 3 | RAR | R-CH LFO DATA |
| 4 | RAL | L-CH LFO DATA |
| 5 | IN | INPUT SIGNAL DATA BUFFER |
| 6 | ROT | R-CH OUTPUT |
| 7 | LOT | L-CH OUTPUT |
| 8 | SAW | SAWTOOTH WAVE OUTPUT |
| 9 | RAT | VALUE CORRESPONDS TO RATE |

MODULATION EFFECT ADDING APPARATUS

BACKGROUND OF THE INVENTION

1. Field of the Invention

The present invention relates to apparatus which add modulation effects to an acoustic signal generated by an electronic musical instrument or the like, and more particularly to such apparatus which changes a degree of modulation or delay time caused by an LFO (Low Frequency Oscillator).

2. Description of the Related Art

Conventionally, apparatus which adds to an acoustic signal effects involving modulation such as a tremolo, vibrato or chorus are realized by the use of an analog circuit such as an LFO, a VCR (Voltage Controlled Amplifier) or a BBD (Bucket Brigade Device). Especially, a modulation LFO has an important roll of controlling a VCO (Voltage Controlled Oscillator) which determines notes, etc., and a VCF (Voltage Controlled Filter) which changes tones to produce effects such as vibratos. Recently, digital signal processing techniques have greatly been developed, especially, including memories and a DSP (Digital Signal Processor). For example, such a conventional modulation effect adding apparatus is disclosed in Published Unexamined Japanese Patent Application Sho 58-108583. This apparatus includes means for generating modulation information which varies with time in correspondence to a desired modulation effect, and an address counter which generates address data which varies with time at a predetermined rate. It sequentially stores digitally encoded musical signals in time series at addresses appointed by the address information, reads the musical signal stored in the past at the address indicated by the difference between the address information and the modulation information from the time series musical signals, outputs a phase or frequency modulated version of the read musical signal based on the modulation .information to thereby form address data AR which fluctuates by a value indicated by the data MD' around the address "AW-AOF" spaced by the value indicated by the data AOF from the address n appointed by the address signal AW at the current time t, as shown in FIG. 21. Namely, the address data AW is modulated with data AOF and MD' and output as an address signal AR for reading the musical signal.

Since such conventional modulation effect adding apparatus is arranged to write input signals sequentially into a memory, reads them sequentially and provides an effect of delay in accordance with the difference between the write and read addresses, however, it must be arranged that the read address does not exceed the write address when the read address is modulated. For example, if the relative relationship between the conventional write address and modulated read address is modulated beyond a predetermined value, as shown in FIG. 22, the read address would exceed the write address WA, as shown by a dot-dashed line in FIG. 22. Therefore, there is the problem that the maximum value of depth of modulation must be limited by the delay time DT in non-modulation.

Since the LFO is difficult to constitute using simple logical circuits in such conventional effect adding apparatus, waveform data is frequently stored as a table in memory, so that a big capacity memory is required. Having all waveform data entities in an LFO which generates a waveform of long period is not practical because the number of data entities is immense. Thus, a method of interpolating data with limited data entities is employed. However, this method requires the use of many memories. In addition, if the LFO waveform is to be changed, the data in many memories must be rewritten, disadvantageously.

Recently, many kinds of waveforms such as sinusoidal waveforms, triangular waveforms and rectangular waveforms are often required to be generated from an LFO to add various effect sounds. In such case, the LFO which itself already requires many memories only for low frequency oscillation requires additional waveform data used for generating the respective waveforms, so that a large amount of memory is required, disadvantageously.

SUMMARY OF THE INVENTION

The present invention is intended to solve the above problems with the prior art. It is an object of the present invention to provide a modulation effect adding apparatus in which the maximum value of depth of modulation determined by the magnitude of the LFO waveform is not limited by the delay time in non-modulation and in which the LFO waveform can easily be changed.

According to an aspect of the present invention to achieve this object, there is provided a modulation effect adding apparatus comprising:

means for inputting to the apparatus a signal to which a modulation effect is to be added;

oscillating means for outputting a waveform signal including multiple high harmonic components and changing in a positive- or negative-going direction at a particular period;

filter means for low-pass filtering the waveform signal from the oscillating means;

means for setting a cutoff frequency in the filter means;

offset adding means for adding to the waveform signal from the filter means a first offset value corresponding to the maximum peak value of that waveform signal;

offset multiplying means for multiplying the waveform signal to which the first offset value from the offset adding means is added by a second offset value corresponding to a predetermined magnification and inverting the waveform signal;

means for changing the second offset value delivered to the offset multiplying means; and means for modulating the signal input to said inputting means on the basis of the waveform signal from the offset multiplying means.

According to the present arrangement, many waveforms ranging from a triangular waveform to a sinusoidal waveform can be easily selected as the LFO waveform continuously to thereby provide various modulation effects without using a large amount of memory as was in the prior art. Even if the amplitude of the LFO waveform is increased and deep modulation is performed, the read address at which the input waveform is read does not exceed the write address disadvantageously, the maximum value of the modulation depth is not limited by the delay time in non-modulation, and the depth of modulation is changeable freely.

It is another object of the present invention to provide a modulation effect adding apparatus with an LFO which can easily change the obtained waveform using a relatively simple method.

According to an aspect of the present invention to achieve the object, there is provided a modulation effect adding apparatus comprising:

means for inputting to the apparatus a signal to which a modulation effect is to be added;

oscillating means for outputting a waveform signal including multiple high harmonic components;

low-pass filter means for filtering the waveform signal from the oscillating means;

means for setting a cutoff frequency in said low-pass filter means; and means for modulating the signal input to the inputting means on the basis of the waveform signal filtered by the low-pass filter means.

According to this arrangement, the low frequency signal including high harmonic components generated by the oscillating means is input to the low pass filter means where the high harmonic components are cut off to thereby provide a waveform approximating a sinusoidal waveform. In this case, the resulting waveform is easily changed by providing means for appropriately setting the cutoff frequency in the low-pass filter means.

Therefore, a waveform signal such as a triangular waveform or a rectangular waveform which contains many high harmonic components and which can easily be generated by hardware or an operational device can be fed to a low pass filter (LPF) to obtain a waveform approximating a sinusoidal waveform. In addition, by continuously changing the cutoff frequency of the LPF, any waveform continuously changing from a triangular waveform or rectangular waveform to a sinusoidal waveform can be selected.

It is still another object of the present invention to provide a modulating effect adding the apparatus in which the maximum value of depth of modulation determined by the magnitude of the amplitude of the LFO waveform is not limited by the delay time in non-modulation.

According to an aspect of the present invention to achieve this object, there is provided a modulation effect adding apparatus comprising:

means for inputting to the apparatus a signal to which a modulation effect is to be added;

oscillating means for outputting a waveform signal changing in a positive- or negative-going direction at a particular period;

offset adding means for adding to a waveform signal from the oscillating means a first offset value corresponding to the maximum peak value of that waveform signal;

offset multiplying means for multiplying a waveform signal to which the first offset value is added by a second offset value corresponding to a predetermined magnification and inverting the waveform signal;

means for changing the second offset value delivered to the offset multiplying means; and means for modulating the signal input to the input means on the basis of the waveform signal generated by the offset multiplying means.

According to this arrangement, the first offset value corresponding to the maximum peak value of the waveform signal which changes at a predetermined period in a positive- or negative-going direction with 0 (zero) as the center from the oscillating means is added to that waveform signal. The waveform signal including the first offset value added thereto is multiplied by the second offset value corresponding to a predetermined magnification and inverting the waveform signal and the resulting signal is fed to the modulation means. In this case, the fed offset values are selected so as to be appropriate ones depending on external operation.

Therefore, if the parameter corresponding to the depth of modulation is increased, modulation is performed only in the direction in which the delay time in modulation increases compared to that in non-modulation to thereby prevent the read address from exceeding the write address. As a result, a modulation effect adding apparatus is provided in which the maximum value of depth of modulation is not required to be limited depending on the delay time in non-modulation.

BRIEF DESCRIPTION OF THE DRAWINGS

Other objects and features of the present invention will be easily understood by those skilled in the art from the following description of a preferred embodiment of the present invention, when read with reference to the accompanying drawings.

In the drawings:

FIGS. 1–20 show one embodiment of a modulating effect adding apparatus according to the present invention, namely;

FIG. 1 is a schematic of the entire modulation effect adding apparatus;

FIG. 2 is a functional block diagram of the apparatus;

FIG. 4 is a block diagram of a triangular waveform generator of the apparatus;

FIG. 6 is a block diagram of a low pass filter (LPF) of the embodiment;

FIG. 7 is a block diagram of an invert and shift circuit of the embodiment;

FIG. 8 shows an internal structure of a DSP of the embodiment;

FIG. 9 shows an internal structure of a coefficient memory (P) of the embodiment;

FIG. 10 shows the internal structure of a work memory (W) of the embodiment;

FIG. 11 shows the internal structure of a delay offset memory (T) of the embodiment;

FIG. 12 is a flowchart indicative of the setting of parameters by a CPU of the embodiment;

FIG. 13 is a flowchart indicative of the overall operation of the DSP of the embodiment;

FIG. 14 is a flowchart indicative of the operation of the DSP for realizing a triangular waveform generator of the embodiment;

FIG. 15 is a flowchart indicative of the operation of the DSP for realizing a low pass filter (LPF) of the embodiment;

FIG. 16 is a flowchart indicative of the operation of the DSP for realizing an invert and shift circuit of the embodiment;

FIG. 17 is a flowchart indicative of the operation of the DSP for realizing a writing of input signal data into memory;

FIG. 18 is a flowchart indicative of the operation of the DSP for realizing (right) channel processing;

FIG. 20 illustrates the relationship between the write address and the modulated read address;

FIG. 21 shows a change in the read address for the memory; and

FIG. 22 illustrates the relationship between write address and the modulated read address.

DETAILED DESCRIPTION OF THE PREFERRED EMBODIMENT

A preferred embodiment of a modulation effect adding apparatus according to the present invention will be described in more detail with reference to FIGS. 1-20.

Figure 1:
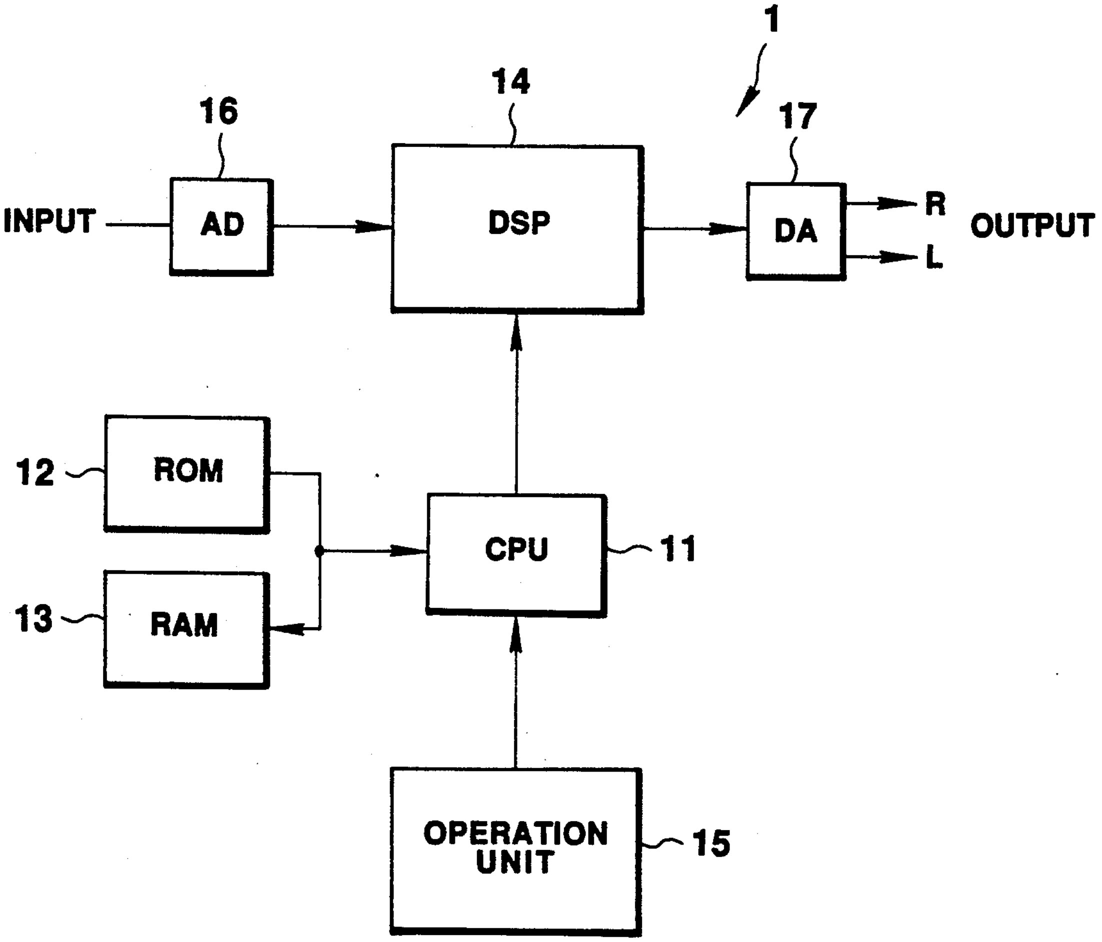

First, the arrangement of the embodiment will be described. FIG. 1 shows the entire structure of the modulation effect adding apparatus having an LFO (Low Frequency Oscillator). In FIG. 1, reference numeral 11 denotes a CPU which provides control over the entire system and various data processing (setting of the parameters) to be described in more detail later. CPU 11 controls the various operations of modulation effect adding apparatus 1 in accordance with a microprogram stored in ROM 12. CPU 11 is connected to ROM 12 which stores a program for the CPU and predetermined fixed data, work RAM 13 which temporarily stores data used for operations and the results of the operations, a DSP (Digital Signal Processor) 14 which serves a modulation effect adding function; and an operation unit 15 which includes switches for setting modulation effects added to a musical signal.

Various coefficients (GF, G, FMD, DT) for effect addition are stored in coefficient RAM 20 shown described and in FIG. 2 later.

CPU 11 reads various coefficients for effect addition from coefficient RAM 20 in accordance with the inputting of data from operation unit 15 and delivers them to DSP 14.

DSP 14 receives a digital version of an input signal from A/D converter 16 and adds a modulation effect to the digital version in accordance with a DSP operating program (FIGS. 13-18) using coefficient RAM 20 which stores coefficients for effect addition, and outputs the resulting signal to D/A converter 17 which then provides an analog version of the resulting digital signal to right and left channels (Rch and Lch).

Figure 2:
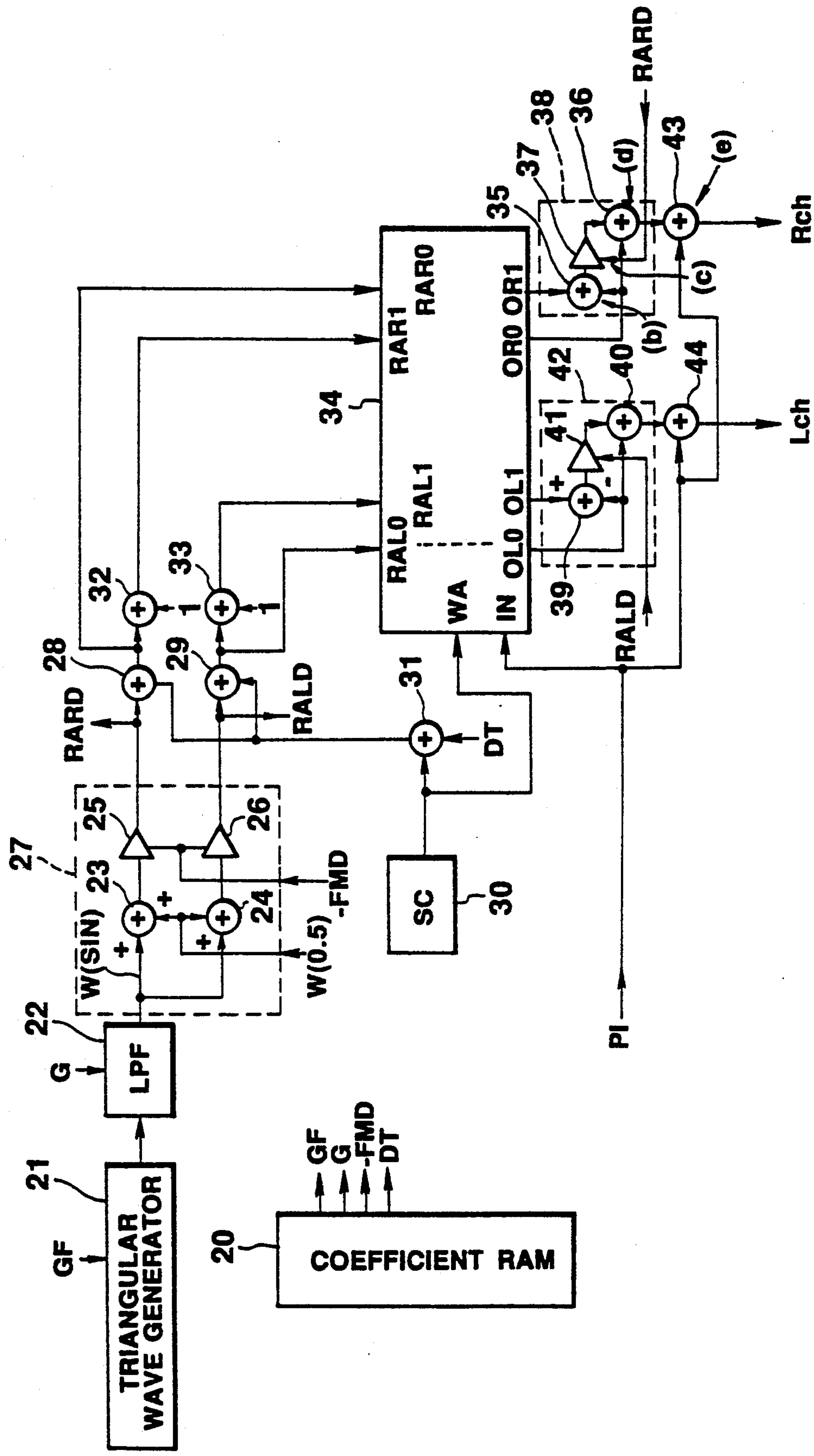

FIG. 2 is a functional block diagram indicative of the overall operation of modulation effect adding apparatus 1. In FIG. 2, reference numeral 20 denotes coefficient RAM which stores various coefficients (GF, G, −FMD, DT) for effect addition. The coefficients GF, G, −FMD, DT stored in coefficient RAM 20 are read by CPU 11 and delivered to the respective circuits concerned, which will be described in more detail later, through the internal buses (not shown). A triangular waveform generator 21 operates as an LFO to generate a triangular waveform of low frequencies on the basis of a trangular waveform generator parameter GF which sets the period of the generated waveform and to input the generated triangular waveform to low pass filter (LPF) 22 provided at the subsequent stage. In this case, a waveform such as a triangular or rectangular waveform which can easily be generated by hardware or an operational device is advantageous. While the particular embodiment uses a triangular waveform as the oscillating waveform by the LFO, any waveform including many harmonic components such as, for example, a sawtooth waveform or a rectangular waveform may be used. The specified structure of triangular waveform generator 21 will be described later with reference to FIGS. 4 and 5.

Figure 3A:
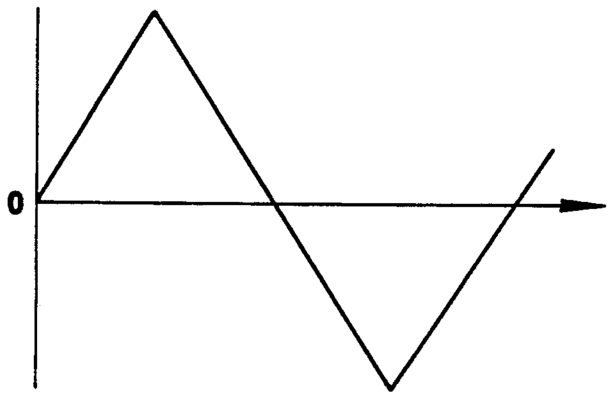
FIGS. 3A–3C show the waveforms of signals at the pertinent elements.
Figure 3B:
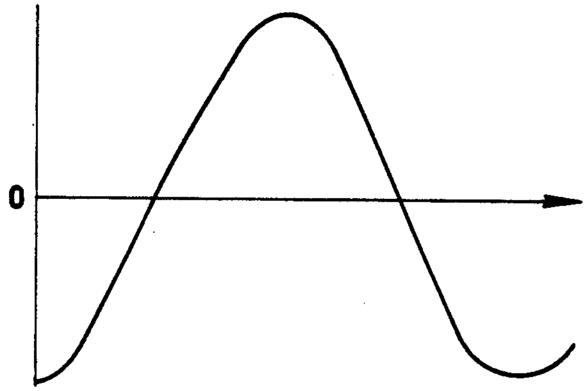

LPF 22 provided at the output side of triangular generator 21 cuts the high harmonic components of the waveform (triangular waveform) generated by triangular waveform generator 21 and exceeding a predetermined cutoff frequency with a predetermined gain on the basis of LPF coefficient G corresponding to the cutoff frequency. Thus, the output waveform (see FIG. 3A) from triangular waveform generator 21 approximates a high harmonic component-free sinusoidal waveform, as shown in FIG. 3B. The cutoff frequency of LPF 2 is arbitrarily changeable depending on the coefficient G which CPU 11 reads from coefficient RAM 20 and delivers. Thus, any waveform which continuously changes from a triangular waveform to a substantially sinusoidal waveform (which is not the complete sinusoidal waveform, but brings about effects similar to those produced by the complete sinusoidal waveform may be selected from the output from triangular waveform generator 21. Thus, the waveform from the triangular waveform generator 21 is hereinafter referred to simply as a sinusoidal waveform).

Figure 3C:
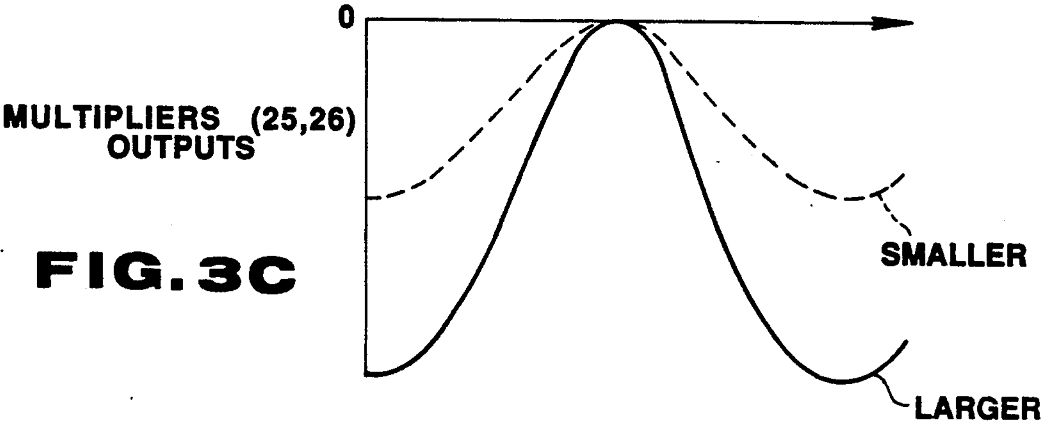

The output W(SIN) from LPF 22 is delivered to invert and shift circuit 27 which comprises adders 23, 24 and multipliers 25 and 26. Invert and shift circuit 27 operates so as to prevent the read address from exceeding the write address even if the depth of modulation is increased by selecting a large amplitude of the address read signal. Adders 23, 24 of invert and shift circuit 27 receive shift constant W (0.5) read from work memory (W) 74 (described later in more detail). Multipliers 25, 26 receive a modulation parameter-FMD read from coefficient RAM 20. Output signal W(SIN) is delivered to both adders 23, 24 to add a modulation effect to right and left channels Rch and Lch. Adders 23, 24 add shift constant W (0.5) corresponding to an offset of an address to the input sinusoidal waveform W(SIN) and output the result to multipliers 25 and 26 provided to control the depth of modulation of a predetermined modulation effect. Multipliers 25, 26 multiply the signal waveforms to which the predetermined offset data are added and shifted by a modulation parameter-FMD (modulation depth) corresponding to the depth of modulation (the signal is inverted because of the minus sign), deliver a particular bit and all other more significant bits as an integer portion to adders 28, 29 and the lower significant bits as a fractional portion to interpolation circuits 38, 42 to be described later in more detail. The outputs of multipliers 25, 26 are shown in FIG. 3C. The waveform shown by the broken lines in FIG. 3C shows the output of multipliers 25, 26 when FMD is 1 or less. As shown in FIG. 3C, since the output of LPF 27 is changed so as to be subjected to modulation after it has been inverted and shifted in the direction in which the delay time increases, the read address does not exceed the write address to whatever extent the depth of modulation may be selected. Therefore, no limitation is placed on the depth of modulation depending on the delay time, and hence an effect having a higher degree of freedom can be added.

A sampling counter (SC) 30 is incremented for each sampling cycle. The output of SC 30 is delivered to SC input terminal WA of a memory 34 to be described later in more detail as well as to adder 31 in which the SC output is added to parameter DT corresponding to the delay time (the time difference from write to read). The result of the addition is delivered to adders 28, 29 where those signals are added to the corresponding integer portions of the results of the multiplications, and the results are input to adders 32, 33 and input as read addresses RAR0, RAL0 to memory 34. Adders 32, 33 increment by 1 (one) the results of the addition by adders 28, 29, and input the resulting outputs as read addresses RAR1, RAL1 to memory 34.

Input musical signals PI to which modulation effects, for example vibratos, are to be added are delivered to input terminal IN of memory 34, and written sequentially at the addresses WA determined in accordance with the outputs WA of sampling counter (SC) 30. The input musical signal is read after read addresses RAR0, RAR1, RAL0 and RAL1 are delayed so as to be equal to address WA. Thus, a musical signal equivalent to a frequency modulation version of the input musical signal is output from memory 34. Data entities read via output terminals OR0, OR1, OL0 and OL1 from corresponding read addresses RAR0, RAR1, RAL0, RAL1 in memory 34 are output to right channel interpolation circuit 38 comprising adders 35, 36 and multiplier 37 and to left channel interpolation circuit 42 comprising adders 39, 40 and multiplier 41. Interpolation circuits 38, 42 directly interpolate data read from memory 34 and output the resulting data entities when the interval of a sampling period is addressed. More specifically, output OR0 read at read address RAR0 and output OR1 read at the next read address RAR1 are input to adder 35, which then subtracts output OR0 from OR1 and outputs the result to multiplier 37 where the result is multiplied by a fraction RARD of the low frequency signal (sinusoidal wave W(SIN)) from invert and shift circuit 27, and the result is added to output OR0 in adder 36. This applies also to the left channel (Lch) interpolation circuit 42 with fraction RALD being used. The outputs from interpolation circuits 38, 42 are then input to adders 43, 44 where those outputs are added to the original tone of the input musical signal PI to thereby output a musical signal with a chorus effect.

Figure 4:
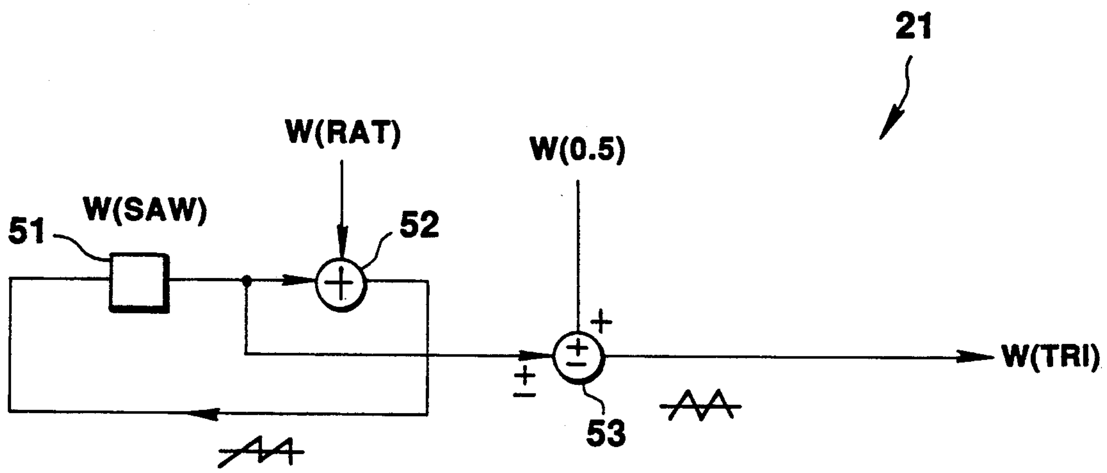

FIG. 4 is a block diagram of one example of triangular waveform generator 21 of FIG. 2. In FIG. 4, triangular waveform generator 21 includes register W(SAW) 51, adder 52 which adds the output of W(SAW) 51 to data on rate W(RAT) read from work memory (W) 74 to be described in more detail later and feeds the result back to the input of W(SAW) 51, and adder 53 which receives a sawtooth waveform output produced by a loop of register 51 and adder 52 and adds the received sawtooth waveform to predetermined shift constant W (0.5) read from work memory (W) 74. By addition of shift constant W (0.5) by adder 53, triangular waveform generator 21 produces a triangular waveform W(TRI).

Figure 6:
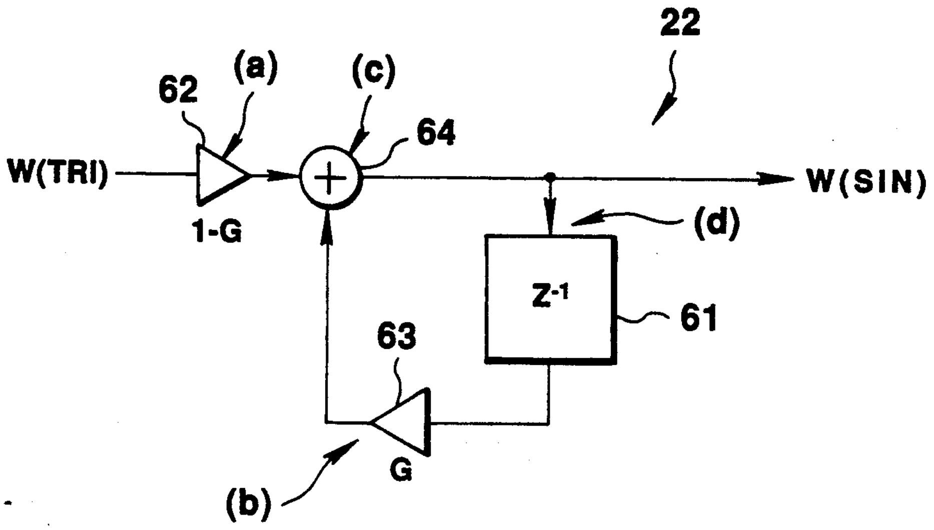

FIG. 6 is a block diagram of an illustrative low-pass filter (LPF) 22 of FIG. 2. In FIG. 6, LPF 22 includes delay element 61, multiplier 62 which multiplies input triangular waveform signal W(TRI) by an LPF coefficient (1−G), multiplier 63 which multiplies the output of delay element 61 by LPF coefficient G, and adder 64 which adds the outputs of multipliers 62 and 63 to produce output waveform W(SIN) approximating a sinusoidal waveform.

Figure 7:
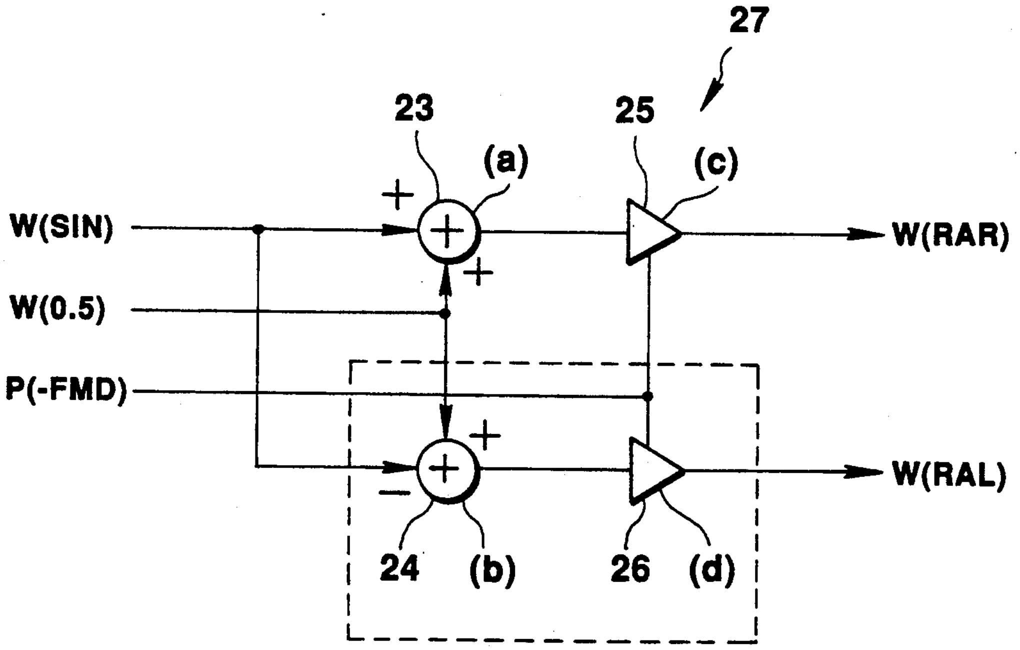

FIG. 7 is a block diagram of invert and shift circuit 27 of FIG. 2 which includes adders 23, 24 which receive a waveform W(SIN) approximating a sinusoidal waveform free from high harmonic components through LPF 22 and adds shift constant W(0.5) to the waveform W(SIN), and multipliers 25, 26 which multiply the corresponding outputs of adders 23, 24 by modulation depth (−FMD) which determines the depth of modulation to thereby output right and left channel LFO data W(RAR) and W(RAL).

Figure 8:
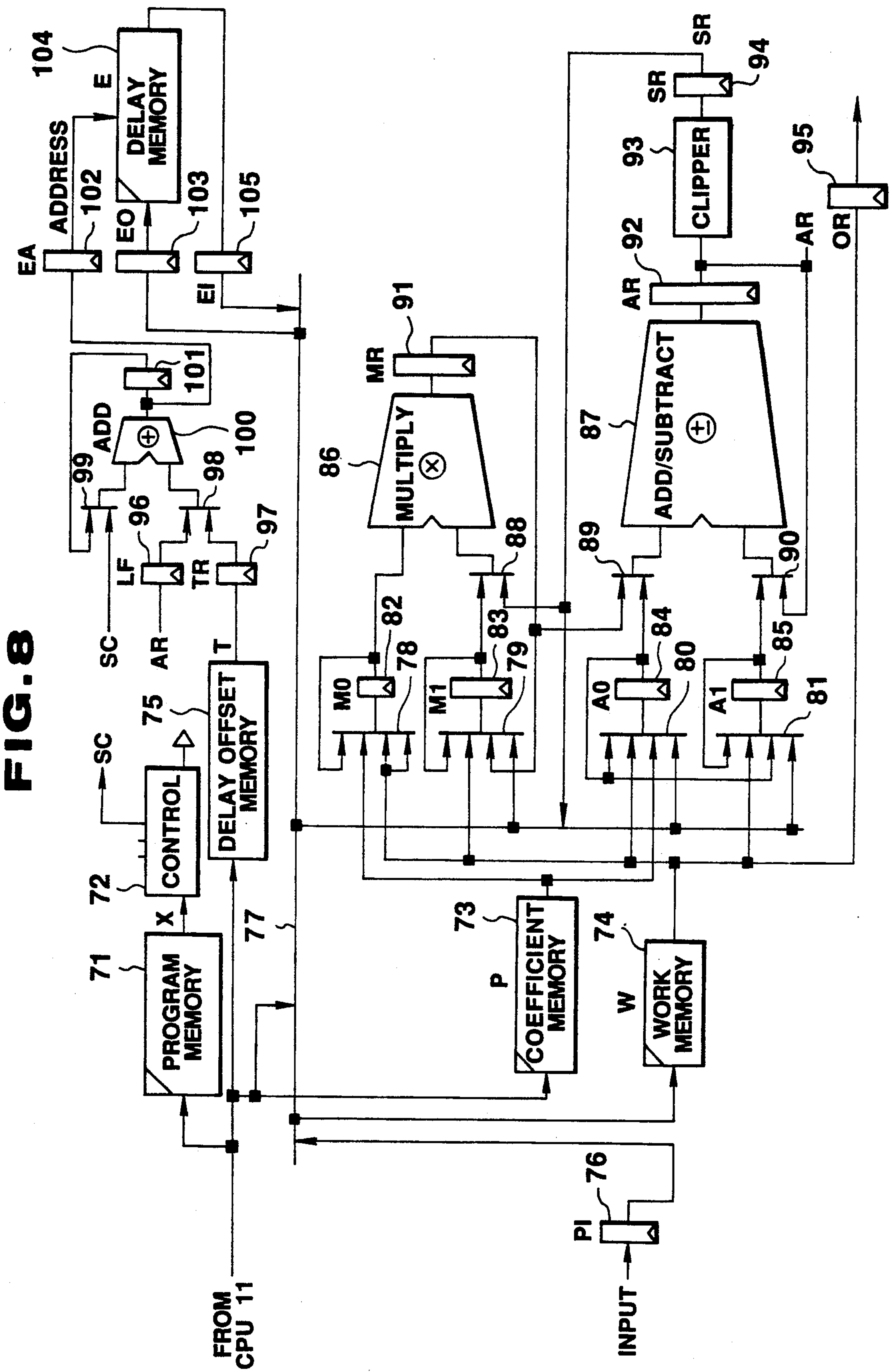

FIG. 8 illustrates the internal structure of DSP 14. In FIG. 8, program memory 71 stores a predetermined program and outputs a predetermined operating program to control circuit 72 in accordance with an instruction from CPU 11. Program memory 71 is connected to an address counter (not shown) and delivers the contents of the program sequentially to control circuit 72 in accordance with addressing by the address counter. Control circuit 72 outputs various control signals for transfer of data between the respective registers and memories, to perform operations on the data, to control the opening and closing of the respective gates and latches, and to provide the output of sampling counter SC to perform desired signal processing, as will be described in more detail later.

Coefficient memory (P) 73 stores various coefficients GF, G, 1−G, −FMD for realizing the generation of a triangular waveform, LPF output, inversion and shift, as described in more detail later in FIG. 9. CPU 11 reads those coefficients GF, G, 1−G, −FMD from coefficient RAM 20 and delivers them to coefficient memory (P) 73 in DSP 14. Work memory 74 temporarily saves waveform signals, etc., prepared by DSP 14, as described in more detail later in FIG. 10. Delay offset memory (T) 75 stores offset values −DT, −DT+1 of the delay time at which data is written into input signal data memory 34, as described in more detail later in FIG. 11. CPU 11 reads such coefficient DT from coefficient RAM 20 and delivers it to delay offset memory (T) 75 in DSP 14.

Input register (PI) 76 stores input digital signal data from an acoustic source (not shown) and delivers it to the pertinent elements through internal bus 77.

The outputs from coefficient memory (P) 73, work memory (W) 74 and input register (PI) 76 are input to terminals of gates 78–81 together with the outputs from the respective registers to be described later in more detail. The outputs from gates 78–81 are input to registers (M0) 82, (M1) 83, (A0) 84, and (A1) 85. Registers (M0) 82, (M1) 83 store intermediate calculated data to be delivered to multiplier 86. Registers (A0) 84, (A1) 85 store intermediate calculated data to be delivered to adder/subtracter 87. The outputs of registers (M1) 83 and (SR) 94 (the latter will be described in more detail later) are input to multiplier 86 via gate 88. The outputs of register (A0) 84 and register (MR) 91 (the latter will be described in more detail later) are input to adder/-subtracter 87 through gate 89, and the outputs of register (A1) 85 and (AR) 92 (the latter will to be described in more detail) are input to adder/subtracter 87 through gate 90. The result of the multiplication by multiplier 86 is stored in register (MR) 91, the output of which is delivered to gates 79 and 89. The result of the calculation by adder/subtracter 87 is stored in register (AR) 92, the output of which is delivered to gate 90 and to register (SR) 94 through clipper 93 to prevent an overflow. The output of register 94 is delivered to gate 88 and also delivered as the result of the calculation on any particular tone to work memory 74 through internal bus 77.

When the result of the calculation is stored in work memory 74 and the series of processing operations is terminated, the data stored in work memory 74 is transferred to output register (OR) 95, which outputs the transferred data to the subsequent unit.

The output of register (AR) 92 is input to register (LF) 96 while the output of delay offset memory (T) 75 is input to register (TR) 97. The outputs of registers 92 and 96 are input to adder 100 through gate 98. The output of sampling counter 30 is input together with the output of register 101, to be described later in more detail, through gate 99 to adder 100. The result of the calculation by adder 100 is stored in register 101 and input to register (EA) 102. The value of register (EA) 102 in which the output of sampling counter (SC) 30 is stored is delivered as an address to delay memory (E) 104. The input musical signal to be processed and stored in input register (PI) 76 is delivered through internal bus 77 to register (EO) 103, the output of which is delivered to delay memory (E) 104. The output of delay memory 104 modulated with a predetermined delay depending on the difference in address is delivered to register (EI) 105.

The musical signal data with the added modulation effect stored in register (EI) 105 is transferred through internal bus 77, for example, to registers (A0) 84, (A1) 85 where it is subjected to R-(L-) channel processing in accordance with the processing of FIG. 18, as described later in more detail.

FIG. 9 shows the internal structure of coefficient memory (P) 73. Triangular waveform generator parameter GF corresponding to the period of low frequency oscillation is stored at address 0; LPF coefficient G corresponding to a parameter which changes the waveform of the LPF is stored at address 1; LPF coefficient (1−G) corresponding to a parameter which changes the waveform of the LPF is stored at address 2; and modulation data (modulation depth) (−FMD) corresponding to the depth of frequency modulation is stored at address 3. CPU-11 reads coefficients GF, F, 1−G, and −FMD from coefficient RAM 20 and delivers them to coefficient memory (P) 73 of DSP 14 for storing purposes.

FIG. 10 shows the internal structure of work memory (W) 74 which temporarily stores the signals produced in the course of calculation. TRI corresponding to the output of triangular waveform generator 21 is stored at address 0; SIN corresponding to the LPF output is stored at address 1; a coefficient of 0.5 corresponding to the shift constant is stored at address 2; RAR corresponding to the contents of the right channel LFO data is stored at address 3; RAL corresponding to the contents of the left channel LFO data is stored at address 4; IN corresponding to the contents of the input signal data buffer is stored at address 5; ROT corresponding to the right channel output is stored at address 6; LOT corresponding to the left channel output is stored at address 7; SAW corresponding to the contents of sawtooth data is stored at address 8; and value RAT corresponding to the rate is stored at address 9.

FIG. 11 shows the internal structure of delay offset memory (T) 75 of FIG. 8 which stores delay time offset (−DT) corresponding to the time difference from write to read at address 0 and delay time offset (−DT+1) corresponding to the time difference from write to read at address 1.

The operation of the present embodiment will now be described.

Figure 12:
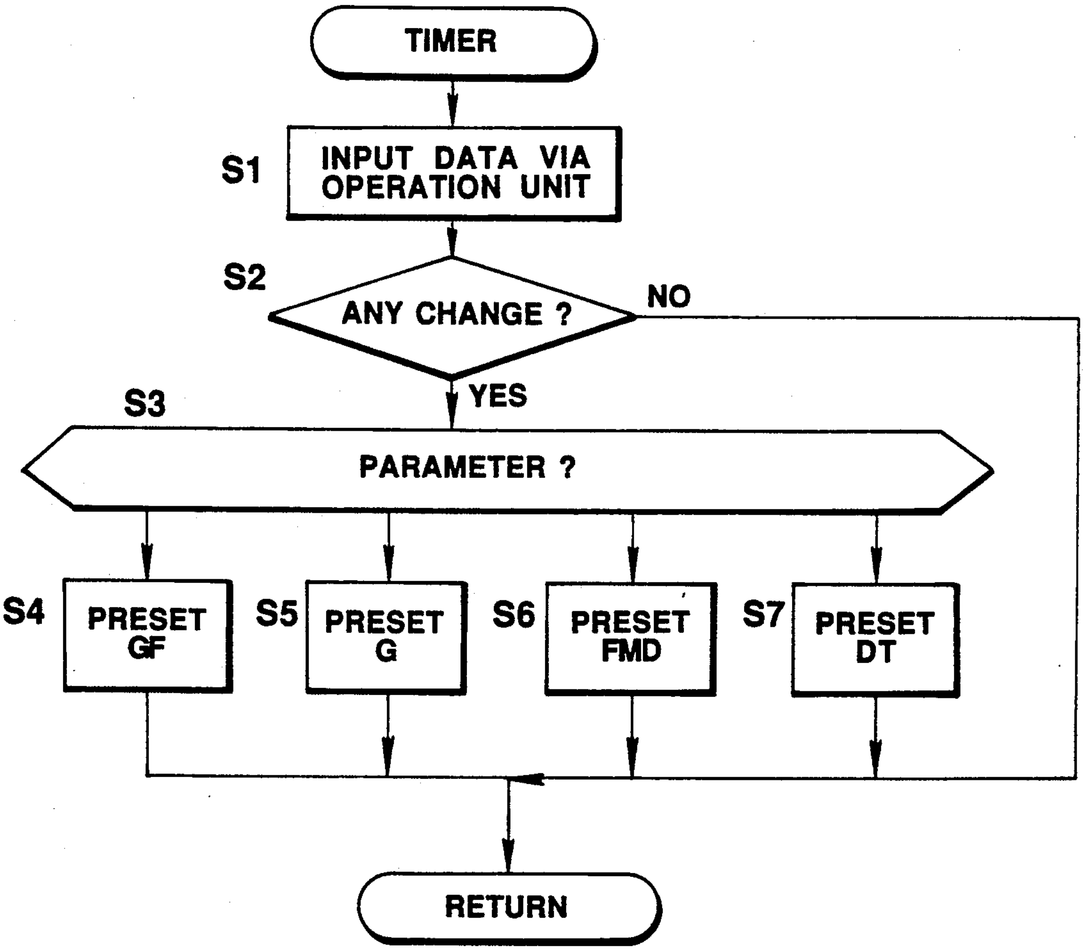

Setting parameters by CPU 11:

FIG. 12 is a flowchart indicative of the processing including reading required coefficients from coefficient RAM 20 and setting the resulting coefficients GF, G, FMD and DT in DSP 14. This flow is processed at predetermined periods on an interruption basis. In FIG. 12, the sign Sn (n=1, 2, . . .) shows each of the steps of the flow.

First, at step S1 data is input by operation unit 15. At step S2 it is checked whether there is any change in the data input by the operation unit 15. If so, at steps S3 it is determined which parameter is to be set by operation unit 15. If otherwise, the processing is terminated. When it is determined that a parameter which changes the period of the LFO is to be set by inputs through operation unit 15, triangular waveform generator 21 parameter GF is reset at step S4 and then the processing is terminated. If it is determined that a parameter which changes the LFO is to be set, LPF coefficient G is reset at step S5 and the processing is then terminated. If it is determined that a parameter which changes the depth of the LFO modulation is to be set, modulation depth FMD is reset at step S6 and the processing is then terminated. If it is determined that the delay time taken from write to read is to be set, delay time offset DT is reset at step S7 and the processing is then terminated.

Processing by DSP 14

Figure 13:
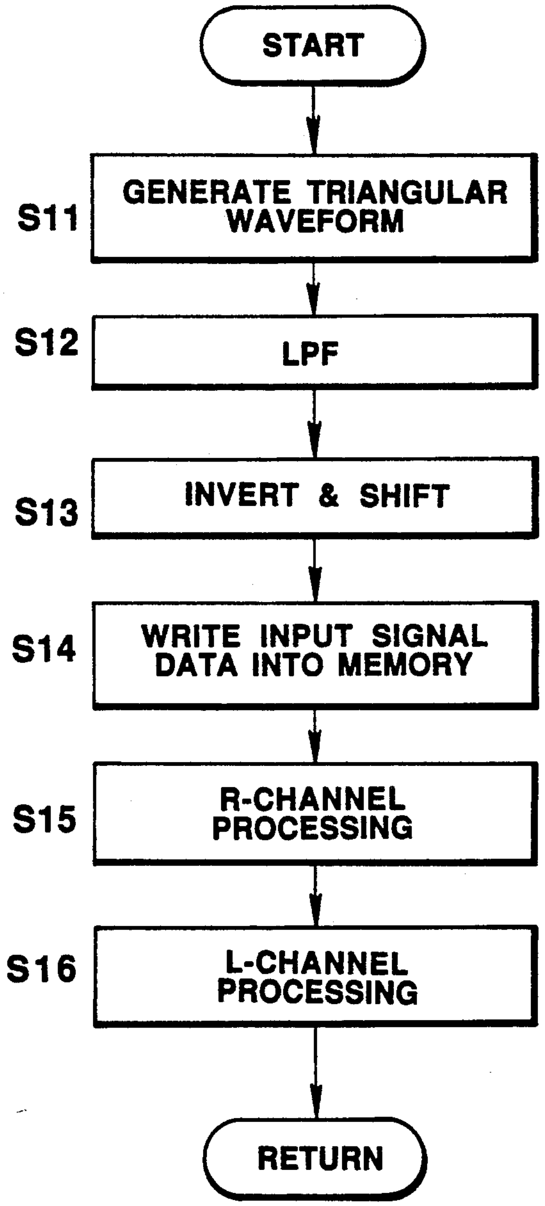

FIG. 13 is a flowchart indicative of the entire operation of modulation effect adding apparatus 1 constructed by DSP 14. This flowchart is a representation of the program stored in program memory 71 of DSP 14. By performing the processing based on this flowchart on DSP 14 of FIG. 8, modulation effect adding apparatus 1 of FIG. 2 is realized. The specified steps of this flowchart will be described later with reference to FIGS. 14–18.

In FIG. 13, first, at step S11 a triangular waveform is generated as a low frequency signal output by triangular waveform generator 21. At step S12, by causing the generated triangular waveform to pass through LPF 22, the high harmonic components are cut off to provide a waveform signal W(SIN) approximating a sinusoidal waveform. At step S13 waveform signal W(SIN) is inverted and shifted by invert and shift circuit 27 such that whatever value the depth of modulation is selected to, the read address does not exceed the write address. At step S14 the input signal data after inverting and shifting operations is written into memory 34. At step S15 right channel processing is made in which modulation and interpolation are made. At step S16 left channel processing is made in which modulation and interpolation are made for the left channel (Lch) and the processing of this flow is then terminated.

Figure 14:
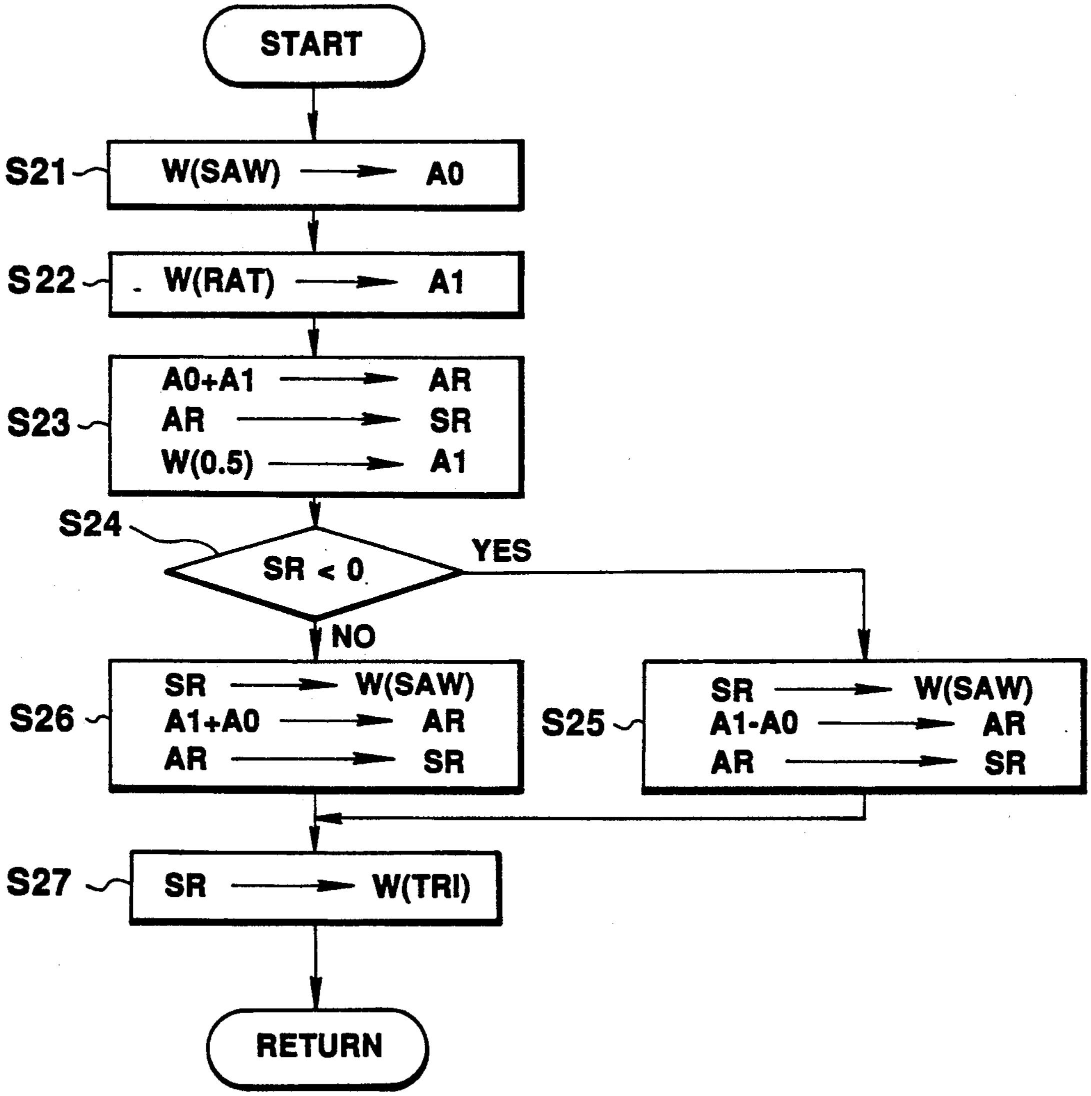

FIG. 14 shows the processing for realizing triangular waveform generator 21 of FIG. 2. This flowchart corresponds to step S11 of FIG. 13. By performing the processing using this flowchart on DSP 14 of FIG. 8, triangular generator 21 of FIG. 4 is realized.

First, at step S21 sawtooth waveform data SAW is read from work memory (W) 74 and set in register (A0) 84 (W(SAW)→A0). At step S22 value RAT corresponding to the rate is read from work memory 74 and set in register (A1) 85 (W(RAT)→A1). At step S23 the value of data SAW set in register (A0) 84 and the value RAT corresponding to the rate set in register (A1) 85 are added and the result is set in register (AR) 92 (A0+A1→AR), and then the value in register 92 is transferred to register (SR) 94 (AR→SR). Shift constant (0.5) is read from work memory (W) 74 and set in register (A1) 85 (W(0.5)→A1). This processing corresponds in FIG. 4 to the addition, by adder 52, of sawtooth waveform data W(SAW) read from work memory (W) 74 to value W(RAT) corresponding to a predetermined rate to produce a sawtooth waveform (see FIG. 5A). At step S24 it is determined whether the addition value stored in register (SR) 94 is negative (SR<0) or not. If so, control passes to step S25 where the addition value stored in register (SR) 94 is stored at a predetermined storage area (SAW) in work memory (W) 74 for the next processing (SR→W(SAW)), the value of sawtooth waveform data SAW set in register (A0) 84 is subtracted from the value of shift constant (0.5) set in register (A1) 85 and the resulting subtraction value is set in register (AR) 92 (A1−A0→AR). The value of register (AR) 92 is then transferred to register (SR) 94 (AR→SR). Since the value of the sawtooth waveform generated is negative as shown in FIG. 3B when SR<0, this corresponds in FIG. 4 to the generation of a triangular waveform shown by (a) in FIG. 5B by subtraction of the processed sawtooth waveform data from shift constant (0.5) by adder 53.

Figure 5A:
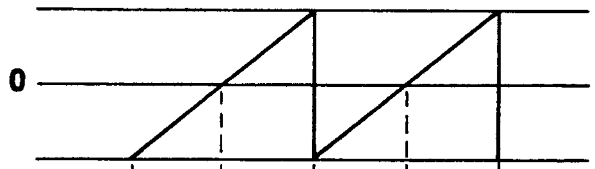
FIGS. 5A–5B show the waveforms of the signals at the respective pertinent elements of the FIG. 4 block diagram.
Figure 5B:
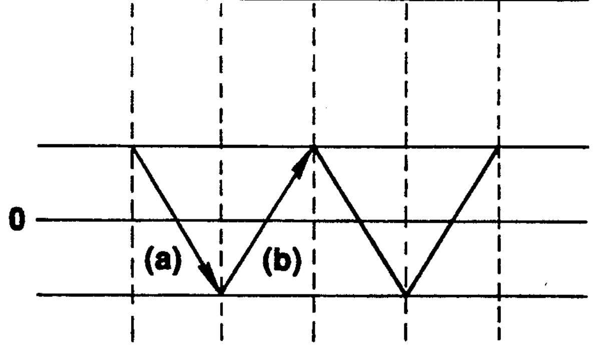

At step S24 when the addition value is positive (SR≧0), control passes to step S26 where the addition value stored in register (SR) 94 is transferred to a predetermined storage area (SAW) in work memory (W) 74 for the next processing (SR→W(SAW)); the value of shift constant (0.5) in register (A1) 85 is added to the value of sawtooth waveform data SAW set in register (A0) 84 and the resulting addition value is set in register (AR) 92 (A1−A0→AR). The value in register (AR) 92 is transferred to register (SR) 94 (AR→SR). Since the generated sawtooth waveform has a positive value as shown in FIG. 5A when SR≧0, this corresponds in FIG. 4 to the generation of a triangular waveform shown by (b) in FIG. 5B by the addition, by adder 53, of shift constant (0.5) to the processed sawtooth waveform data for monotonous increase's sake.

At step S27 the addition/subtraction value obtained at step S25 or S26 is stored in a predetermined area (TRI) in work memory (W) 74 (SR→W(TRI) and the processing is then terminated. Control then returns to step S21 and similar processing is iterated at each sampling period. Thus, DSP 14 performs the above flow at each sampling period on a time divisional basis to thereby realize triangular waveform generator 21 which generates a triangular waveform shown in FIG. 3C.

Figure 15:
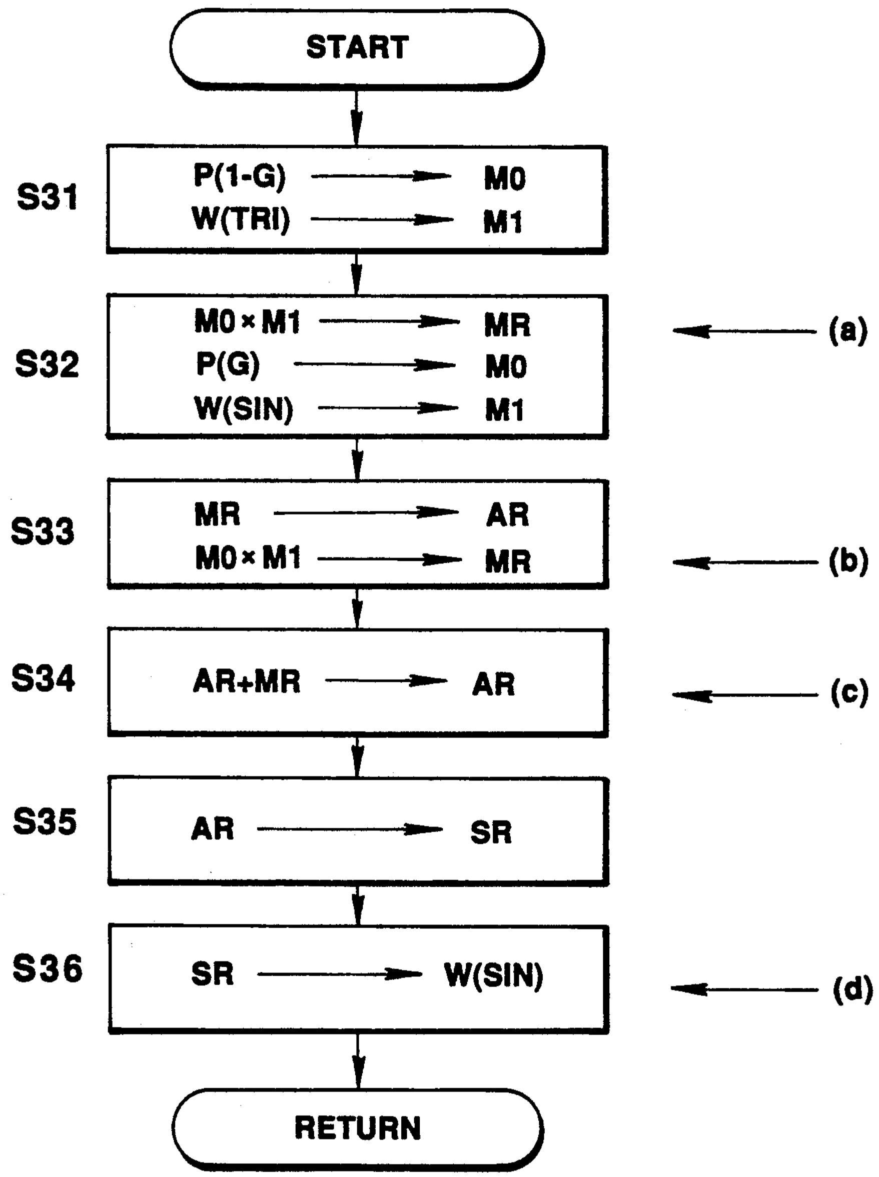

FIG. 15 shows the processing for realizing low pass filter (LPF) 22 of FIG. 2. This flowchart corresponds to step S12 of FIG. 13. By performing the processing using this flowchart on DSP 14 of FIG. 8, low pass filter 22 of FIG. 6 is realized. The signs (a)-(d) of FIGS. 15 and 6 are used to illustrate the corresponding states of the processing operations.

First, at step S31 LPF coefficient (1-G) is read from coefficient memory (P) 73 and set in register (M0) 82 (P(1-G)→M0). Further, triangular waveform data TRI calculated and stored by the FIG. 14 processing is read from work memory (W) 74 and set in register (M1) 83 (W(TRI)→M1). Then at step S32 the value of coefficient (1-G) set in register (M0) 82 is multiplied by the value of triangular waveform data TRI set in register (M1) 83 and the resulting value is set in register (MR) 91 (M0×M1→MR); and LPF coefficient G is read from coefficient memory (B) 73 and set in register (M0) 82 (P(G)→M0); and the last LPF output SIN is read from work memory (W) 74 and set in register (M1) 83 (W(SIN)→M1). As shown by (a) in FIG. 6, this corresponds to the multiplication, by multiplier 62, of input triangular waveform data TRI by LPF coefficient (1-G). At step S33 the multiplication value set in register (MR) 91 is transferred to register (AR) 92 (MR→AR); the value of coefficient G set in register (M0) 82 is multiplied by the value of the last MF output SIN set in register (M1) 83 and the resulting value is set in (MR) 91 (M0×M1→MR). As shown by (b) in FIG. 6, this corresponds to the multiplication by multiplier 63, of LPF coefficient G by the last LFP output SIN corresponding to the output of delay element 61 of one sampling period ago. At step S34 the value of the multiplication value obtained at step 32 and set in register (AR) 92 is added to the value of the multiplication value obtained at step 33 and set in register (MR) 91, and the resulting value is set in register (AR) 92 (AR+MR→AR). As shown by (c) in FIG. 6, this corresponds to addition, by adder 64, of the result of multiplication of triangular waveform data TRI by coefficient (1-G) to the result of multiplication of the last LPF output SIN by a factor of coefficient G. At step S35 the value of register (AR) 92 is transferred to register (SR) 94. At step S36 the value set in register (SR) 94 by the above operation is written as output data SIN approximating a sinusoidal waveform corresponding to the contents of the LPF output at an appropriate address in work memory (W) 74 (SR→W(SIN)), and this processing is then terminated (see (d) in FIG. 6). Control returns to step S31, and similar processing is iterated at each sampling period.

By the above processing, the function of DSP 14 is realized which serves as LPF 22 which cuts off high harmonic components of the triangular waveform SIN from triangular waveform generator 21. Namely, the high harmonic components of triangular waveform SIN as the oscillating output from low frequency oscillator (LFO) are cut by LPF 22 provided at the output stage of the LFO to produce a waveform approximating a sinusoidal waveform. In this case, by changing the value of coefficient G and hence the cutoff frequency, the output waveform is easily changed from a waveform approximating a triangular waveform to a waveform approximating a sinusoidal waveform. Such change is only required to change the value of the coefficient, so that it can be achieved on a real time basis.

Figure 16:
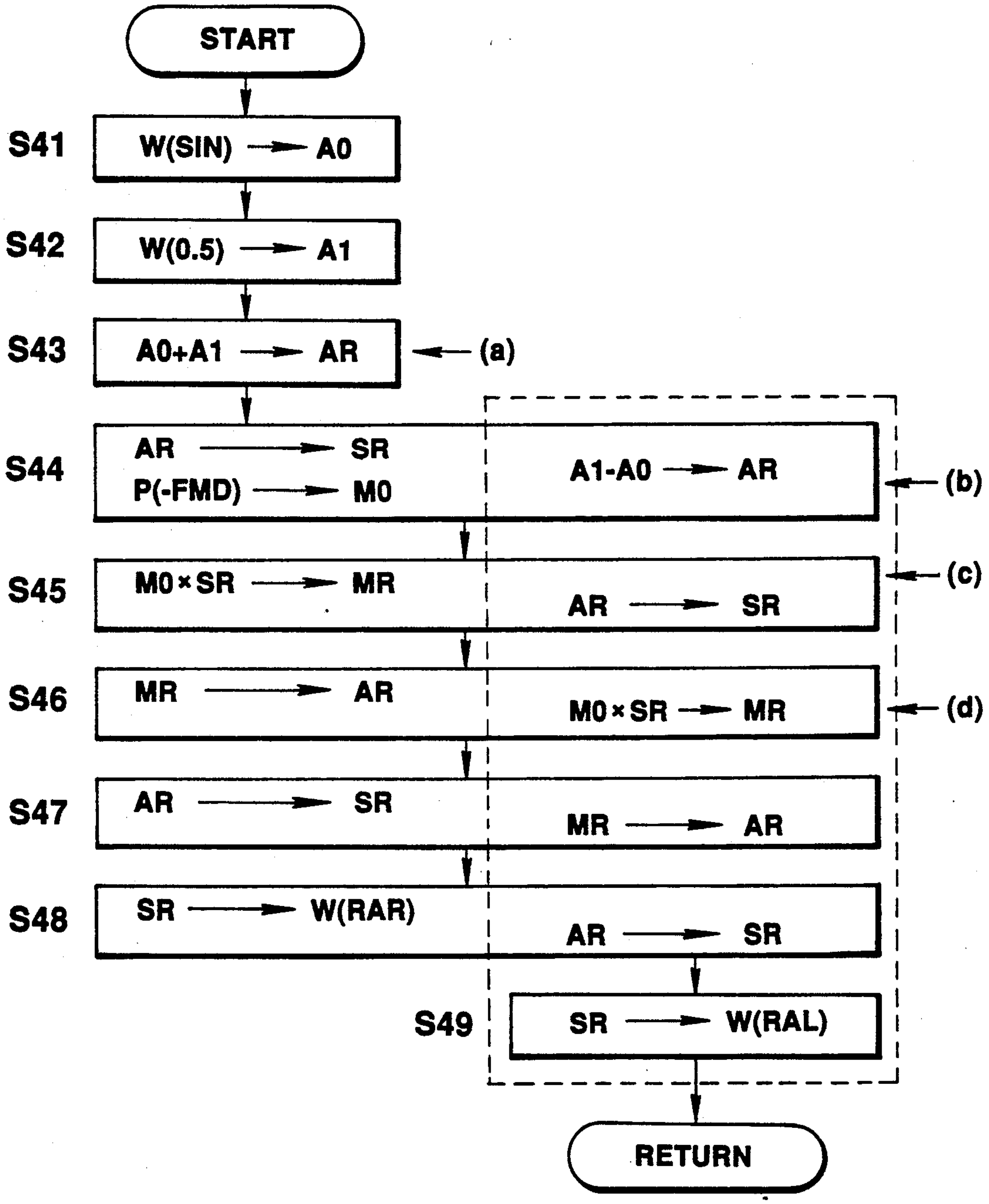

FIG. 16 shows the processing for realizing invert and shift circuit 27 of FIG. 2. This flowchart corresponds to step S13 of FIG. 13. By performing the processing using this flowchart on DSP 14 of FIG. 8, invert and shift circuit 27 of FIG. 7 is realized. The right and left channels of invert and shift circuit 27 perform processing operations similar to each other. The left-channel processing operations are shown enclosed by broken lines in FIGS. 16 and 7 in which the signs (a)-(d) illustrate the corresponding states of the processing operations.

First, at step S41 the LPF output SIN corresponding to sinusoidal waveform data obtained by the FIG. 14 processing is read from work memory (W) 74 and set in register (A0) 84 (W(SAW)→A0). At step S42 shift constant (0.5) is read from work memory (W) 74 and set in register (A1) 85 (W(0.5) →A1). At step S43 the value of LPF output SIN set in register (A0) 84 is added to the value of shift constant (0.5) set in register (AR) 85, and the resulting value is set in register (AR) 92 (A0+A1→AR). As shown by (a) in FIG. 7, this corresponds to the addition, by adder 23, of LPF output data W(SIN) read from work memory (W) 74 to value W (0.5) corresponding to a shift constant of 0.5, namely, to the addition of an offset to a sinusoidal waveform. At step S44 the value of register (AR) 92 is transferred to register (SR) 94 (AR→SR), the value of LPF output SIN set in register (A0) 84 is subtracted from the value of shift constant (0.5) set in register (A1) 85 and the resulting value is set in register (AR) 92 (A1−A0→AR) <left-channel processing>, and modulation depth (−FMD) is read from coefficient memory (P) 73 and set in register (M0) 82 (P(−FMD)→M0). As shown by (b) in FIG. 7, this corresponds to the subtraction, by adder 24, of LPF output data W(SIN) from value W (0.5) corresponding to the value read from work memory (W) 74 to thereby add an offset to a sinusoidal waveform in the left channel side. At step S45 the value of modulation depth (−FMD) set in register (M0) 82 is multiplied by the value set in register (SR) 94 and the resulting value is set in register (MR) 91 (M0×SR→MR), and the value in register (AR) 92 is transferred to register (SR) 94 (AR→SR) <left channel processing>. As shown by (c) in FIG. 7, this corresponds to the addition, by adder 23, of LPF output data W (SIN) to value W(0.5) corresponding to a shift constant of 0.5 and the multiplication, by multiplier 25, of the output value from adder 23 by modulation depth (−FMD). At step S46 the value in register (MR) 91 is transferred to register (AR) 92 (MR→AR), the value of modulation depth (−FMD) set in register (M0) 82 is multiplied by the value set in register (SR) 94, and the resulting value is set in register (MR) 91 (M0×SR→MR) <left channel processing>. As shown by (d) in FIG. 7, this corresponds to subtraction of LPF output data W (SIN) from the value W (0.5) corresponding to a shift constant of 0.5 and multiplication, by multiplier 26, of the resulting value by modulation depth (−FMD). At step S47 the value of register (AR) 92 is transferred to register (SR) 94 (AR→SR), and the value of register (MR) 91 is transferred to register (AR) 92 (MR→AR) <left channel processing>. At step S48 the value set in register (SR) 94 is written as right-channel LFO data RAR at an appropriate address in work memory (W) 74 (SR→W(RAR)), and the value in register (AR) 92 for left-channel processing is transferred to register (SR) 94 (AR→SR) <left channel processing>. At step S49 the value set in register (SR) 94 is written as left-channel LFO data RAL at an appropriate address in work memory (W) 74 (SR→W(RAL)), the processing is then terminated, control returns to step S41, and similar processing is then iterated at each sampling period. As just described above, according to this flow, the left channel processing similar to the right channel processing is performed delayed one step from the right-channel processing, as shown enclosed by the broken lines in FIG. 16, so that invert and shift circuit 27 of FIG. 7 is realized.

Figure 17:
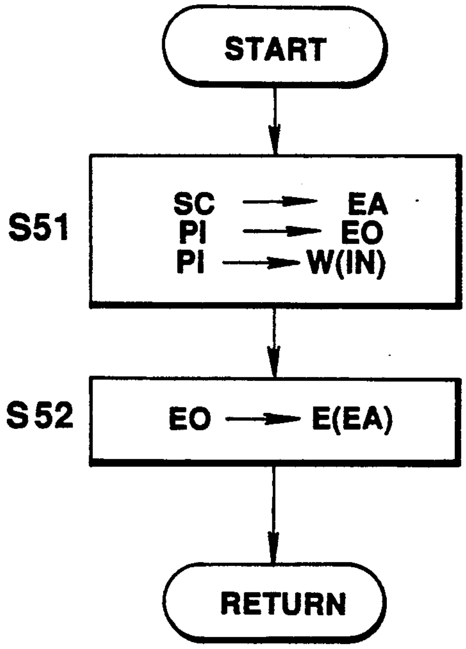

FIG. 17 shows the processing to realize writing the input signal data into memory 34. This flowchart corresponds to the step S14 of FIG. 13. The present processing using this flowchart is performed on DSP 14 shown in FIG. 8.

At step S51 the value of sampling counter (SC) 30 is set in register (EA) 102 (this value will be an address) (SC→EA), input musical signal PI is set in register (EO) 103 (PI→EO), and the value of register (PI) 76 is transferred to input signal data buffer IN of work memory (W) 74 for later processing purposes (PI→W(IN)). Then, at step S52 the value of input signal data PI set in register (EO) 103 is input into delay memory (E) 104 at an address comprising the value of the value of sampling counter (SC) 30 set in register (EA) 102 (EO→E(EA)) to thereby terminate writing the input signal data into delay memory (E) 104.

Figure 18:
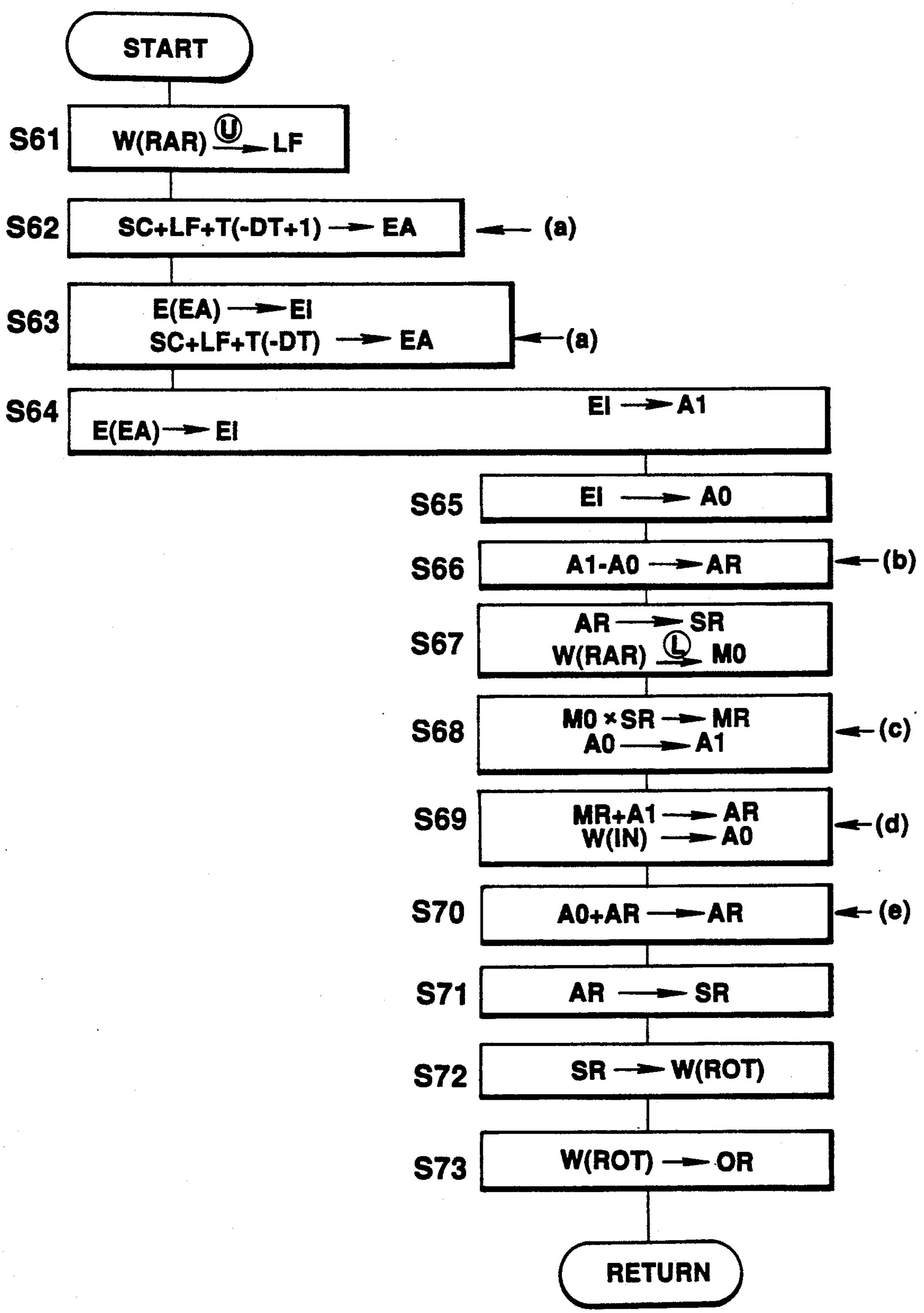
Figure 19A:
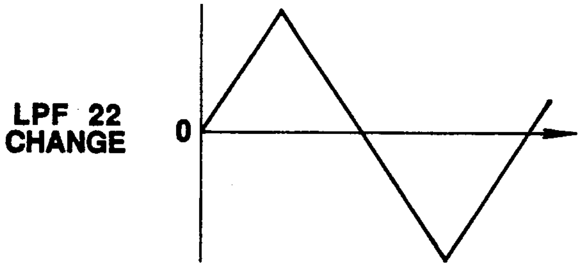
FIGS. 19A–19D show waveforms which illustrate the states of frequency modulation occurring when the output of the low pass filter (LPF) is changed.
Figure 19C:
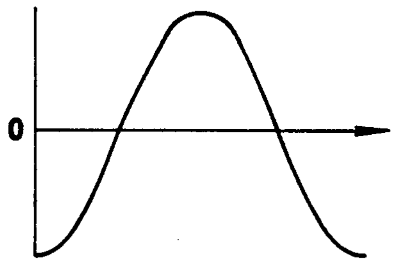
Figure 19B:
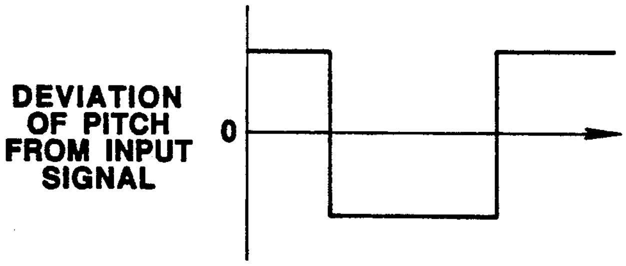
Figure 19D:
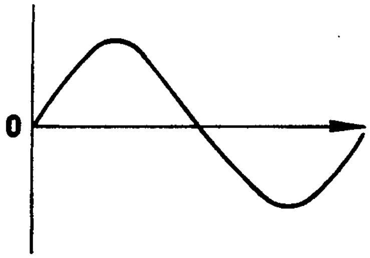

FIG. 18 is a flowchart indicative of the details of the right channel processing operation at step S15 of FIG. 13 performed on DSP 14 shown in FIG. 7. The signs (a)-(e) in FIGS. 18 and 2 illustrate the states of the processing operations.

First, at step S61 only the integer portion of right-channel LFO data RAR is read from work memory (W) 74 and transferred to register (LF) 96 (W(RAR)→FL). At step S62 the value of sampling counter (SC) 30, the right-channel LFO data RAR set in register (LF) 96, and delay time offset (−DT+1) read from delay offset memory (T) 75 are added, and the resulting value is set as an address counter in register (EA) 102 (SC+LF+T(−DT+1)→EA). Namely, the value of sampling counter (SC) 30 is added to the value of the modulated (sinusoidal) signal set in register (LF) 96, the resulting value is added to delay (−DT+1), and the result is stored in register (EA) 102. Here, register (EA) 102 functions as an address counter and the value stored in register (EA) 102 is read as an address. Then, at step S63 the value set in register (EA) 102 is transferred to register (EI) 105 (E(EA)→EI). The value of sampling counter (SC) 30, the right-channel LFO data RAR set in register (LF) 96, and delay time offset (−DT) read from delay offset memory (T) 75 are added, and the resulting value is set as the address counter in register (EA) 102 (SC+LF+T(−DT)→EA). Namely, the value of the modulated (sinusoidal) signal set in register (LF) 96 is added to the value of sampling counter (SC) 30, and delay (−DT) and the resulting value is set in register (EA) 102, a modulated version of the sum of the value of sampling counter (SC) and delay (−DT+1) is read and input to register (EI) 105. The addition value (EA) read at step S62 has an address which has advanced by one compared to the addition value (EA) read at step S63. At step S64 the value set in register (EI) 105 is transferred to register (A1) 85 (EI→A1). The value of sampling counter (SC) 30, right-channel LFO data RAR and the value of delay time offset (−DT+1) set in register−(EA) 102 are transferred to register (EI) 105 (E(EA)→EI). Then, at step S65 the value set in register (EI) 105 is transferred to register (A0) 84 (EI→A0). At step S66 the value of the last addition value read at the last address set in register (A0) 84 is subtracted from the value of the current addition value is set in register (A1) 85, and the resulting difference is set in differential register (AR) 92 (A1−A0→AR). As shown by (b) in FIG. 2, this corresponds to the subtraction, by adder 35, of modulated output OR0 from modulated output OR1 of only an integer portion from memory 34 and delivery of the result to multiplier 37. Then, at step S67 the value of the difference value set in register (AR) 92 is transferred to register (SR) 94 (AR→SR), and only the fraction portion of right-channel LFO data RAR is read from work memory (W) 74 and transferred to register (M0) 82 (W(RAR)→M0) in order to perform interpolation since the integer portion is already read at step S61. At step S68 the value of the difference value set in register (SR) 94 is multiplied by the value of the right-channel LFO data RAR set in register (M0) 82, the resulting value is set in register (MR) 91 (M0×SR→MR), and the value of register (A0) 84 is transferred to register (A1) 85 (A0→A1). As shown by (c) in FIG. 2, this corresponds to multiplication of the difference value output from adder 35 by right-channel LFO data (fraction) RAR by multiplier 37. At step S69 the value of the multiplication data set in register (M0) 82 is added to the value of register (A1) 85, the resulting value is set in register (AR) 92 (MR+A1→AR), and input signal data buffer IN is read from work memory (W) 74 and transferred to register (A0) 84 (W(IN)-→A0).

As shown by (d) in FIG. 2, this corresponds to addition, by adder 36, of the value, to be interpolated, output from multiplier 37 to the integer output OR0 read at last address and delivery of the resulting interpolated value to multiplier 43. At step S70 the value of input signal data buffer IN set in register (A0) 84 is added to the value of the addition value set in register (AR) 92, and the resulting value is set in register (AR) 92 (A0+AR→AR). As shown by (e) in FIG. 2, this corresponds to the addition, by adder 43, of a frequency modulated (vibrato) output of interpolator 38 to the original tone (input musical signal PI) to thereby add a chorus effect. At step S71 the value set in register (AR) 92 is transferred to register (SR) 94 (AR→SR). At step S72 the value set in register (SR) 94 is written as right-channel output ROT at appropriate addresses in areas in work memory (W) 74 (SR→W(ROT)). At step S73 right channel output ROT which is stored by the above processing is read from work memory (W) 74 and transferred to register (OR) 95 (W(ROT)→OR), the right channel processing is terminated, control returns to step S61, and similar processing is iterated at each sampling period to realize the right channel processing shown in FIG. 2. The left channel processing can be made in quite a similar manner.

FIG. 19 shows waveforms indicative of the states of frequency modulation obtained when the output of LPF 22 is changed. FIGS. 19A–19C show how the outputs of interpolators 38, 42 are frequency modulated by the pitch of the input signal when the output of LPF 22 is changed from FIG. 19A to FIG. 19C by changing the cutoff frequency G of LPF 22. The output of triangular waveform generator 21 (see FIG. 19A) changes to a waveform approximating a sinusoidal waveform free from high harmonic components as shown in FIG. 19C by causing the output of triangular waveform generator 21 to pass through LPF 22. In this case, when, conventionally, a triangular waveform of FIG. 19A is directly input to interpolators 38, 42, the pitch of the input signal only changes as shown in FIG. 19B. In contrast, in the present embodiment, provision of LPF 22 causes a sinusoidal waveform of FIG. 19C to be obtained, so that when this sinusoidal signal is input to the interpolators 38, 42, a change in the pitch of the input signal is obtained, as shown in FIG. 19D. By changing the coefficient given to LPF 22, any waveform changing from the waveform of FIG. 19B to that of FIG. 19D and with a desired frequency modulation is realized on a real time basis.

Figure 20:
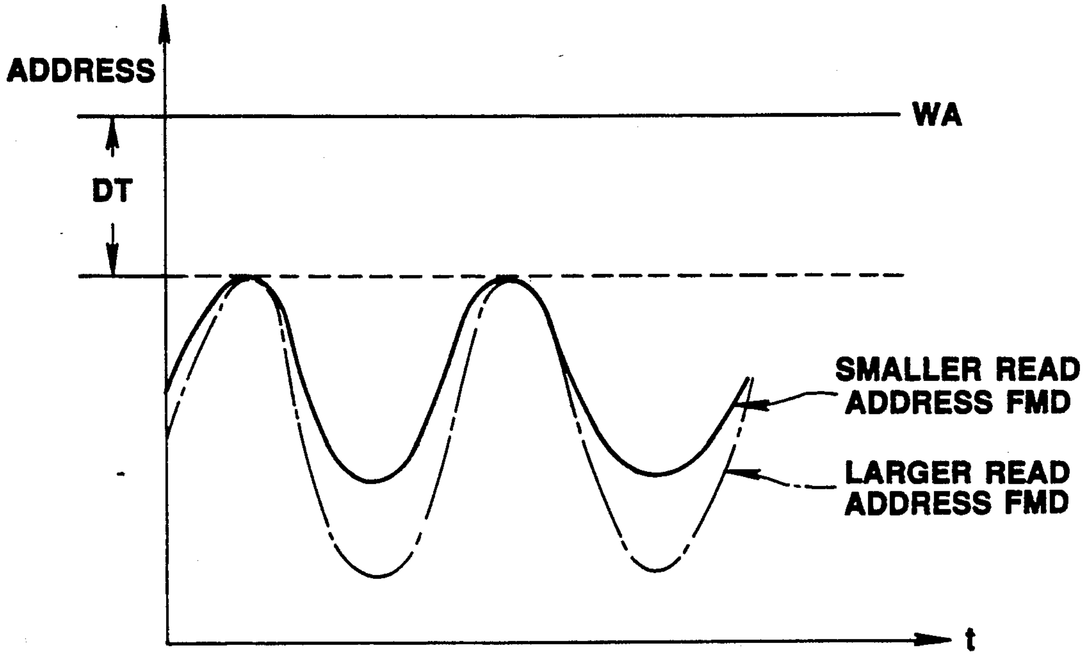
Figure 22:
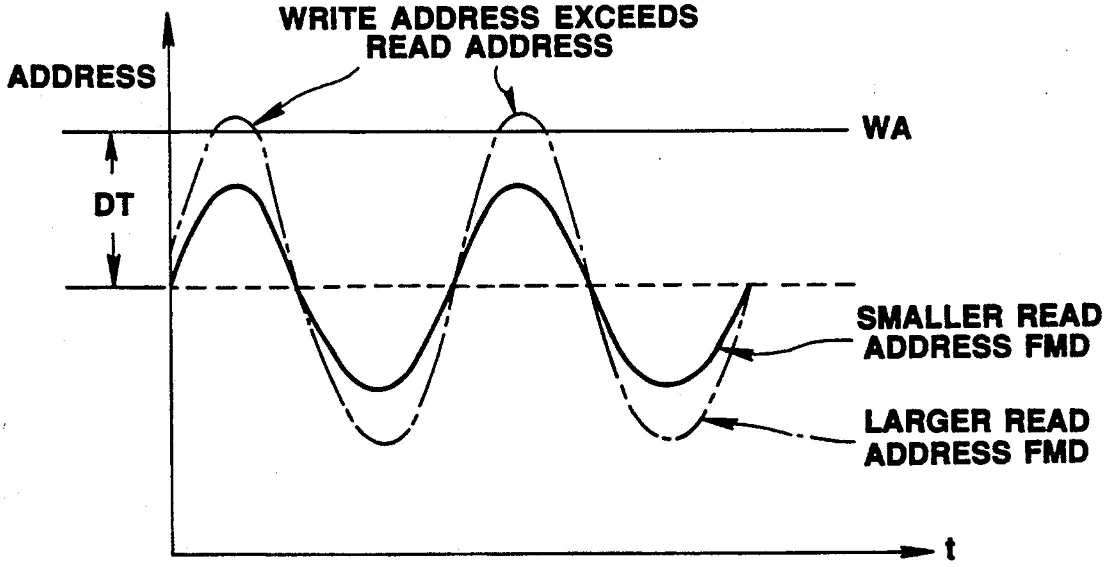
FIGS. 21 and 22 show a conventional modulation effect adding apparatus; namely.
Figure 21:
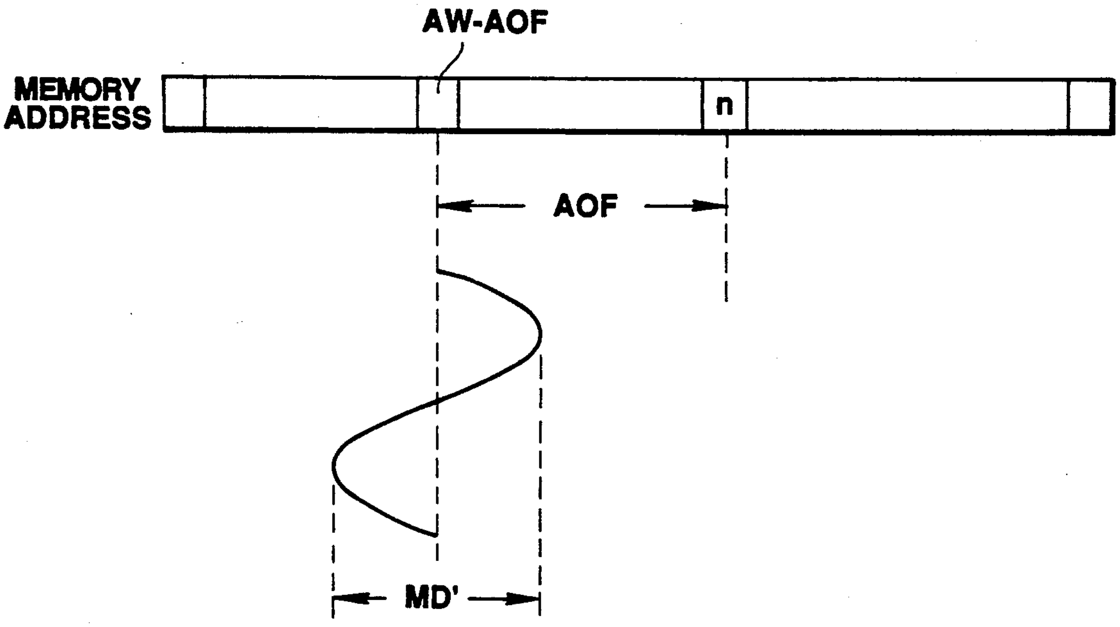

As described above, according to the present embodiment, triangular waveform generator 21 is used which functions as low frequency oscillating means which outputs a waveform signal data changing with 0 as the center in a positive- or negative-going direction at predetermined periods. Shift constant (0.5) corresponding to the maximum peak value of the waveform signal from triangular waveform generator 21 is added by invert and shift circuit 27 to that waveform signal data. The waveform signal data to which the shift constant (0.5) is added is multiplied by a negative modulation depth (−FMD) which determines the depth of modulation of the waveform signal data and inverts the waveform signal data. Therefore, even if the depth of modulation is increased by the modulation means, modulation becomes effective only in the direction in which the delay time increases compared to non-modulation. In addition, even if the depth of modulation is increased as shown in FIG. 20, the read address does not exceed the write address. As a result, the maximum value of the depth of modulation is not required to be limited depending on the delay time in non-modulation and thus a modulation effect adding apparatus with improved degree of freedom is realized. In the present embodiment, the shortest delay time can be set by using a parameter corresponding to the delay time. Since the pitch is constant irrespective of the parameter, setting the parameter is easy advantageously.

While triangular waveform generator 21 is used as an LFO which generates a low frequency signal in the present invention, any device which can output a waveform signal containing multiple high harmonic components may be used. For example, a device which can generate a rectangular wave-form having multiple harmonic components may be used.

The number of delay circuits constituting invert and shift circuit 27, etc., the capacity of the waveform data memory, etc., are not limited to those of the embodiment, mentioned above. For example, they may be increased as required, of course.

What is claim is:

1. A modulation effect adding apparatus comprising:
- means for inputting to said apparatus a signal to which a modulation effect is to be added;
- oscillating means for outputting a waveform signal including multiple high harmonic components and changing in a positive- or negative-going direction at a particular period;
- filter means for low-pass filtering the waveform signal from said oscillating means;
- means for setting a cutoff frequency in the filter means;
- offset adding means for adding to the waveform signal from said filter means a first offset value corresponding to the maximum peak value of said waveform signal from said filter means;
- offset multiplying means for multiplying the waveform signal to which the first offset value from said offset adding means is added by a second offset value corresponding to a predetermined magnification to form a multiplied waveform signal and inverting the multiplied waveform signal;
- means for changing the second offset value delivered to said offset multiplying means; and
- modulating means for modulating the signal input to said inputting means on the basis of the waveform signal from said offset multiplying means, said modulating means comprising:
- sampling counter means for counting at a predetermined period;
- means for subtracting a given value from the count output of said sampling counter means;
- count output adding means for adding up the count output from said subtracting means and the waveform signal from said offset multiplying means; and
- memory means responsive to the count output from said sampling counter means for sequentially storing the input signals from said inputting means and reading the stored input signal in accordance with the output from said count output adding means.

2. An apparatus according to claim 1, wherein said filter means includes digital filter means.

3. An apparatus according to claim 2, comprising:

means for storing a plurality of kinds of filter coefficients for said digital filter means; and means for selecting a set of filter coefficients from said coefficient storing means in correspondence to the setting by said setting means and delivering the selected set of the filter coefficients to said digital filter means.

4. An apparatus according to claim 1, wherein said changing means comprises:

offset storing means for storing a plurality of said second offset values; and means for delivering to said offset multiplying means one of the second offset values stored in said offset storing means in response to an external operation.

5. An apparatus according to claim 1, wherein said modulating means comprises means for inverting the waveform signal from said offset multiplying means;

wherein said subtracting means and said count output adding means each are two in number so as to receive signals from said offset multiplying means and said inverting means; and wherein two stored input signals are read simultaneously from said memory means in response to said two subtracting means.

6. An apparatus according to claim 1, wherein said modulating means comprises:

second adding means for adding a particular value to the output from said count output adding means; and means for interpolating the input signal read from said memory means on the basis of the output from said second adding means in accordance with the input signal read by said count output adding means and the waveform signal from said offset multiplying means.

7. An apparatus according to claim 6, wherein said interpolating means comprises:

second subtracting means for subtracting the output read by said count output adding means from the output of said memory means read on the basis of the output of said second adding means;

means for multiplying the output of said second subtracting means by the waveform signal from said offset multiplying means; and third adding means for adding up the output of said multiplying means and the output read by the output of said count output adding means.

8. A modulation effect adding apparatus comprises:

means for inputting to said apparatus a signal to which a modulation effect is to be added;

oscillating means for outputting a waveform signal including multiple high harmonic components;

low-pass filter means for filtering the waveform signal from said oscillating means;

means for setting a cutoff frequency in said low-pass filter means; and modulating means for modulating the signal input to said inputting means on the basis of the waveform signal filtered by said low-pass filter means, said modulating means comprising:

sampling counter means for counting at a predetermined period;

means for subtracting a given value from the count output of said sampling counter;

means for adding up the count output from said subtracting means and the waveform signal from said low-pass filter means; and memory means responsive to the count output from said sampling counter means for sequentially storing the input signals from said inputting means and reading the stored input signals in accordance with the output from said adding means.

9. An apparatus according to claim 8, wherein said modulating means comprises means for inverting the waveform signal from said low-pass filter means;

wherein said subtracting means and said adding means each are two in number so as to receive signals from said low-pass filter means and said inverting means; and wherein two stored input signals are read simultaneously from said memory means in response to said two subtracting means.

10. An apparatus according to claim 8, wherein said low-pass filter means includes digital filter means.

11. An apparatus according to claim 10, comprising:

means for storing a plurality of kinds of filter coefficients for said digital filter means; and means for selecting a set of filter coefficients from said coefficient storing means in correspondence to the setting by said setting means and delivering the selected set of the filter coefficients to said digital filter means.

12. An apparatus according to claim 8, wherein said modulating means comprises:

second adding means for adding a particular value to the output from said count output adding means; and means for interpolating the input signal read from said memory means on the basis of the output from said second adding means in accordance with the input signal read by said count output adding means and the waveform signal from said low-pass filter means.

13. An apparatus according to claim 12, wherein said interpolating means comprises:

second subtraction means for subtracting the output read by said count output adding means from the output of said memory means read on the basis of the output of said second adding means;

means for multiplying the output of said second subtracting means by the waveform signal from said low-pass filter means; and third adding means for adding up the output of said multiplying means and the output read by the output of said count output adding means.

14. A modulation effect adding apparatus comprising:

means for inputting to said apparatus a signal to which a modulation effect is to be added;

oscillating means for outputting a waveform signal changing in a positive-or negative-going direction at a particular period;

offset adding means for adding to a waveform signal from said oscillating means a first offset value corresponding to the maximum peak value of that waveform signal;

offset multiplying means for multiplying a waveform signal to which the first offset value is added by a second offset value corresponding to a predetermined magnification and inverting the waveform signal;

means for changing the second offset value delivered to said offset multiplying means; and modulating means for modulating the signal input to said input means on the basis of the waveform signal generated by said offset multiplying means, said modulating means comprising:

sampling counter means for counting at a predetermined period;

means for subtracting a given value from the count output of said sampling counter means;

count output adding means for adding up the count output from said subtracting means and the waveform signal from said offset multiplying means; and memory means responsive to the count output from said sampling counter means for sequentially storing the input signals from said inputting means and reading the stored input signals in accordance with the output from said count output adding means.

15. An apparatus according to claim 14, wherein said changing means comprises offset storage means for storing a plurality of said second offset values; and means for delivering to said offset multiplying means one of the offset values stored in said offset storage means in correspondence to external operation.

16. An apparatus according to claim 14, wherein said modulating means comprises means for inverting the waveform signal from said offset multiplying means;

wherein said subtracting means and said count output adding means each are two in number so as to receive signals from said offset multiplying means and said inverting means; and wherein two stored input signals are read simultaneously from said memory means in response to said two subtracting means.

17. An apparatus according to claim 14, wherein said modulating means comprises:

second adding means for adding a particular value to the output from said count output adding means; and means for interpolating the input signal read from said memory means on the basis of the output from said second adding means in accordance with the input signal read by said count output adding means and the waveform signal from said offset multiplying means.

18. An apparatus according to claim 17, wherein said interpolating means comprises:

second subtracting means for subtracting the output read by said count output adding means from the output of said memory means read on the basis of the output of said second adding means;

means for multiplying the output of said second subtracting means by the waveform signal from said offset multiplying means; and third adding means for adding up the output of said multiplying means and the output read by the output of said count output adding means.

* * * * *